United States Patent
Zhang et al.

(10) Patent No.: US 11,050,042 B2
(45) Date of Patent: Jun. 29, 2021

(54) DISPLAY PANEL MOTHERBOARD, DISPLAY PANEL AND METHOD OF MANUFACTURING THE SAME

(71) Applicant: Yungu (Gu'an) Technology Co., Ltd., Langfang (CN)

(72) Inventors: Feng Zhang, Langfang (CN); Yang Li, Langfang (CN); Sha Yuan, Langfang (CN); Xiaojia Liu, Langfang (CN); Feng Yu, Langfang (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 57 days.

(21) Appl. No.: 16/568,272

(22) Filed: Sep. 12, 2019

(65) Prior Publication Data

US 2020/0006704 A1    Jan. 2, 2020

Related U.S. Application Data (63) Continuation of application No. PCT/CN2018/118020, filed on Nov. 28, 2018.

(30) Foreign Application Priority Data

May 14, 2018    (CN) .......................... 201810456671.7

(51) Int. Cl.
| | | |
|---|---|---|
| *H01L 51/52* | (2006.01) | |
| *H01L 27/32* | (2006.01) | |
| *H01L 51/00* | (2006.01) | |

(52) U.S. Cl.
CPC ...... *H01L 51/5253* (2013.01); *H01L 27/3244* (2013.01); *H01L 51/0097* (2013.01);
(Continued)

(58) Field of Classification Search
None
See application file for complete search history.

(56) References Cited

U.S. PATENT DOCUMENTS

| | | |
|---|---|---|
| 2014/0327110 A1 | 11/2014 | Gridelet et al. |
| 2017/0237038 A1 | 8/2017 | Kim et al. |

(Continued)

FOREIGN PATENT DOCUMENTS

| | | |
|---|---|---|
| CN | 102437288 A | 5/2012 |
| CN | 104051673 A | 9/2014 |

(Continued)

OTHER PUBLICATIONS

Carbaugh, D.J, et. al., "Transparent and visible light-insensitive acrylic photoresist for negative tone optical lithography", J. Vac. Sci. Technol. B 35, 011601 (2017); https://doi.org/10.1116/1.4971198. (Year: 2017).*

(Continued)

*Primary Examiner* — J. E. Schoenholtz
(74) *Attorney, Agent, or Firm* — Kilpatrick Townsend & Stockton (57) ABSTRACT

The present disclosure relates to a display panel motherboard, a display panel, and a method of manufacturing the same, including a plurality of display substrates. The display substrate includes an organic light emitting unit; an array substrate, having at least one first area acting as a notch reserved area, and a second area different from the first area, the organic light emitting unit being formed on the array substrate and located on the second area; an encapsulation layer, formed on a side of the organic light emitting unit facing away from the array substrate and covering the notch reserved area; and an etch protection layer formed on a side of the encapsulation layer facing away from the array substrate.

14 Claims, 5 Drawing Sheets

(52) U.S. Cl.
    CPC ..... *H01L 27/3211* (2013.01); *H01L 2227/323* (2013.01); *H01L 2251/566* (2013.01)

(56)              References Cited

U.S. PATENT DOCUMENTS

2017/0338441 A1*  11/2017  Higano ................. H01L 27/124
2018/0175116 A1*   6/2018  Song .................... G06F 3/0412
2019/0043418 A1*   2/2019  Rieutort-Louis ... H01L 27/3234
2019/0123115 A1    4/2019  Sun et al.
2019/0131569 A1*   5/2019  Ma ...................... H01L 51/5253
2019/0181387 A1*   6/2019  Go ...................... H01L 51/5237
2019/0250746 A1*   8/2019  Han .................... G06F 3/0412
2020/0020752 A1    1/2020  Shi et al.
2021/0074876 A1*   3/2021  Kishimoto ............... G09F 9/33

FOREIGN PATENT DOCUMENTS

CN        104134688 A     11/2014
CN        107579171 A      1/2018
CN        107658332 A      2/2018
CN        107731888 A      2/2018
CN        107808896 A      3/2018
CN        108666352 A     10/2018

OTHER PUBLICATIONS

International Search Report of International Patent Application No. PCT/CN2018/118020.
Office Action of Chinese Patent Application No. 201810456671.7.

* cited by examiner

DISPLAY PANEL MOTHERBOARD, DISPLAY PANEL AND METHOD OF MANUFACTURING THE SAME

CROSS REFERENCE TO RELATED APPLICATIONS

This application is a continuation application for International Application No. PCT/CN2018/118020, filed on Nov. 28, 2018, which claims priority to Chinese Patent Application No. 201810456671.7, titled "DISPLAY PANEL MOTHERBOARD, DISPLAY PANEL AND METHOD OF MANUFACTURING THE SAME" and filed on May 14, 2018. The entireties of these applications are incorporated by reference herein for all purposes.

TECHNICAL FIELD

The present disclosure relates to the field of display technologies.

BACKGROUND

In recent years, with the development of technologies for smart terminal devices and wearable devices, the demand for panel displays has become more diverse. For example, OLED (Organic Light-Emitting Diode) displays eliminate the large energy-consuming backlight module and have self-luminous performance compared with the liquid crystal display, so they have the advantage of better energy saving. In addition, compared with traditional flat panel displays, the OLED displays are widely used in smart terminal products such as mobile phones and tablet computers since they are flexible, with good flexibility.

Since OLED displays are easy to customize the appearance, more and more terminal manufacturers apply them to full screen and borderless products. However, since full-screen and borderless products require a larger light-emitting area. In practical applications, it is generally necessary to provide a mounting notch on the organic light-emitting diode display to reserve a mounting location of hardware such as front camera or telephone receiver on the terminal device.

SUMMARY

According to various embodiments disclosed herein, a display panel motherboard, a display panel, and a method of manufacturing the same are provided.

A display panel motherboard is provided, including a plurality of display substrates, and the display substrate includes an array substrate, an organic light emitting unit, and an encapsulation layer.

The array substrate has at least one first area acting as a notch reserved area, and a second area different from the first area. The organic light-emitting unit is formed on the array substrate, and is located on the second area. The encapsulation layer is formed on a side of the organic light-emitting layer facing away from the array substrate and covering the notch reserved area.

The display substrate further includes an etch protection layer formed on a side of the encapsulation layer facing away from the array substrate.

In the above display panel motherboard, the organic light emitting unit is not deposited in the notch reserved area of the array substrate, and the etching protection layer is disposed on the side of the encapsulation layer facing away from the array substrate. Compared with the laser cutting, by using the dry etching process for removing each film layer in the notch reserved area to forming a notch, the damage to the encapsulation layer and the organic light-emitting unit during the cutting process is avoided, and the production yield of the display panel is improved. Meanwhile, the above display panel motherboard also solves the problem of difficulty in alignment during the laser cutting, thereby reducing the difficulty of notching and improving the precision of notching. Compared with the cutter wheel cutting, the display abnormality and the sensing defect of the periphery of the notch area caused by the damage of the film layer and the line at the periphery of the mounting notch during the cutting process are avoided, thereby improving the production yield of the display panel. In addition, by providing the etch protection layer on the side of the encapsulation layer facing away from the array substrate, the problem of photo-resistance failure of the display area of the display panel caused by exposure and development is solved, thereby improving the production yield of the display panel.

Alternatively, the etch protection layer covers at least the second area of the array substrate.

Alternatively, the etch protection layer is made of a transparent material.

Alternatively, the display substrate includes a display area and a border area surrounding the display area.

The notch reserved area is located within the display area.

A display panel is further provided, including an array substrate, an organic light emitting unit, and an encapsulation layer formed on a side of the organic light emitting unit facing away from the array substrate.

The display panel includes at least one mounting notch, the mounting notch extending through the display panel in a direction perpendicular to the array substrate.

The organic light emitting unit is formed on the array substrate and located on an area outside the mounting notch.

The display panel further includes an etch protection layer formed on a side of the encapsulation layer facing away from the array substrate.

Alternatively, the etch protection layer is made of a transparent material.

Alternatively, the etch protection layer covers at least an area on the display panel other than the mounting notch.

Alternatively, a periphery of the mounting notch edge is provided with an encapsulation layer material having a predetermined thickness, and the encapsulation layer material having the predetermined thickness covers at least one of the organic light emitting units adjacent to the periphery of the mounting notch.

A method of manufacturing a display panel is further provided, includes: providing an array substrate, the array substrate including at least one first area acting as a notch reserved area, and a second area different from the first area; forming an organic light emitting unit on the second area of the array substrate; forming an encapsulation layer on a side of the organic light emitting unit facing away from the array substrate, the encapsulation layer covering the notch reserved area; forming an etch protection layer on a side of the encapsulation layer facing away from the array substrate to form a display substrate; and removing each film layer of the display substrate located within the notch reserved area with an etching process, to form a mounting notch.

Alternatively, the method further includes: providing a bearing substrate; forming a base substrate on the bearing substrate; and forming a thin film transistor, an anode, and a functional film layer sequentially on the base substrate.

The forming the organic light emitting unit on the second area of the array substrate: forming the organic light emitting unit on the functional film layer within the second area.

Alternatively, the etch protection layer is made of a non-transparent material, and the method further includes: removing the etch protection layer.

Alternatively, the forming the thin film transistor, the anode, and the functional film layer sequentially on the base substrate further includes: forming a buffer layer on the base substrate, prior to forming the thin film transistor.

Alternatively, the forming the thin film transistor, the anode, and the functional film layer sequentially on the base substrate further includes: forming a planarization layer on the formed thin film transistor, to form a planar top surface.

Alternatively, the forming the planarization layer on the formed thin film transistor further includes: forming a through hole in the planarization layer, to expose a source electrode and a drain electrode of the thin film transistor.

Alternatively, the organic light emitting unit further includes a plurality of sub-pixels, the array substrate further includes a pixel defining layer, the pixel defining layer has a plurality of pixel defining openings, and each of the pixel defining openings includes a plurality of sub-openings. The forming the organic light emitting unit on the second area of the array substrate further includes: depositing a light-emitting layer for emitting red light, a light emitting layer for emitting green light, and a light emitting layer for emitting blue light on the corresponding plurality of sub-openings in the pixel defining layer respectively with a precision metal mask by an evaporation process, to form the corresponding plurality of sub-pixels.

A display device is further provided, including the above display panel.

DETAILED DESCRIPTION OF THE INVENTION

As explained above, OLED display manufacturing often involves creating notch regions. For example, the method of encapsulating the OLED display device generally includes cover type encapsulation and thin film encapsulation. The thin film encapsulation realizes encapsulation of the OLED device through lamination of an organic thin film layer and an inorganic thin film layer, which is generally used for encapsulation of a flexible OLED display device. For the display panel with the mounting notch, the mounting notch needs to be cut after the encapsulation is completed, and the display panel is cut out from the motherboard.

The method of cutting the display panel generally includes cutter wheel cutting and laser cutting. However, both during the process of the cutter wheel cutting and the laser cutting, it is extremely easily to cause damage to the components on the periphery of the notch area, resulting in that the periphery of the notch area is abnormal in display and poor in sensing.

In order to facilitate the understanding of the present disclosure, the present disclosure will be described more fully hereinafter with reference to the accompanying drawings. Preferred embodiments of the present disclosure are given in the drawings. However, the disclosure can be implemented in many different forms, but is not limited to the embodiments described herein. Rather, these embodiments are provided so that the understanding of the disclosure of the present disclosure will be more thorough.

During the manufacturing of display panels, in order to reduce the manufacturing cost and realize large-scale batch production, it is common to make a plurality of display panels on a large display panel motherboard. And then through a cutting process, the larger display panel motherboard is cut into several separate display panels. Generally, the display panel motherboard includes a motherboard body and an encapsulation structure disposed on the motherboard body. The motherboard body has a plurality of display panels, and each of the display panels is provided with an OLED device. The encapsulation structure includes a plurality of sub-encapsulation structures corresponding to the plurality of display panels, and each sub-encapsulation structure is used to encapsulate an OLED device in a corresponding display panel.

Under the trend that the display panel border is getting narrower and narrower, the distance between the position of the cutting line and the encapsulation boundary of the display component on the display panel motherboard is gradually narrowed. In addition, during the actual application, it is generally required to provide a mounting notch on the display panel to reserve a mounting position for hardware, such as a front camera, a telephone receiver, a home button or a speaker on the terminal device. Conventional techniques generally provide a mounting notch within a non-display area outside the effective display area. Since the area of the effective display area is limited in this way, the effect of "full screen" or "narrow border" cannot be achieved, and therefore, it is necessary to provide a mounting notch in the display area.

Taking the laser cutting in the notching process as an example, the principle of the laser cutting is to cut the film layer by thermal melting, and the encapsulating structure of the flexible display panel is a thin film encapsulation layer formed by an inorganic layer and an organic layer. Since an edge of the thin film encapsulation layer may be damaged by expansion or tear due to absorption of a large amount of heat, moisture may permeate from the side of the display panel, to destroy the organic light emitting unit, so that the display panel cannot achieve long-term excellent display performance. In addition, when laser cutting is used, high-energy laser irradiation generates higher heat, so that the instantaneous temperature may reach 800° C.~1,000° C., and static electricity is generated. This may cause damage to the organic layer, the functional layer, the metal cathode, and the like in the organic light-emitting unit. In addition, laser positioning is difficult during the laser cutting, which also increases the difficulty of cutting and affects the cutting accuracy.

Taking the cutter wheel cutting in the notching process as an example, since the strength of the edge area of the mounting notch is low, the pressing and edging by the cutter wheel may easily cause stress release, cause damage to the film layer and the line, and when the cutter wheel is used for cutting, due to the limited amount of edging of the cutter wheel, the cutting deviation or mistake is prone to occur, which may cause damage to the line at the cutting edge, thereby the periphery of the mounting notch is poor in display and sensing.

Therefore, it is necessary to provide a display panel motherboard and a display panel capable of avoiding display abnormality and poor sensing caused by the notching process of the display panel.

The mounting notch is an area for mounting the hardware structure. For convenience of description, the present disclosure names an area for mounting the hardware structure as a mounting notch, but the name does not limit the present disclosure, and therefore can be modified to other names as needed, for example, a shaped notch, a through hole, a groove, a mounting hole, etc. Preferably, the hardware structure includes at least one or more of the following structures: a front camera, a home button, a telephone receiver or a speaker. The specific mounting method of the hardware structure is not limited hereto. Furthermore, when the mounting notch is formed, the shape of the mounting notch to be cut is determined according to the shape of the hardware structure to be mounted, that is, the mounting notch of a different shape may be provided for different hardware structures. Preferably, the cross-sectional shape of the mounting notch in the direction parallel to the base substrate may be in one or more of the following shapes: circle, ellipse, rectangle, trapezoid, rhombus, square, or the like.

The display panel provided by embodiments of the present disclosure may be mainly applied to a full-screen or a borderless display panel, and may be a display panel having a normal border or a narrow border.

Figure 1:
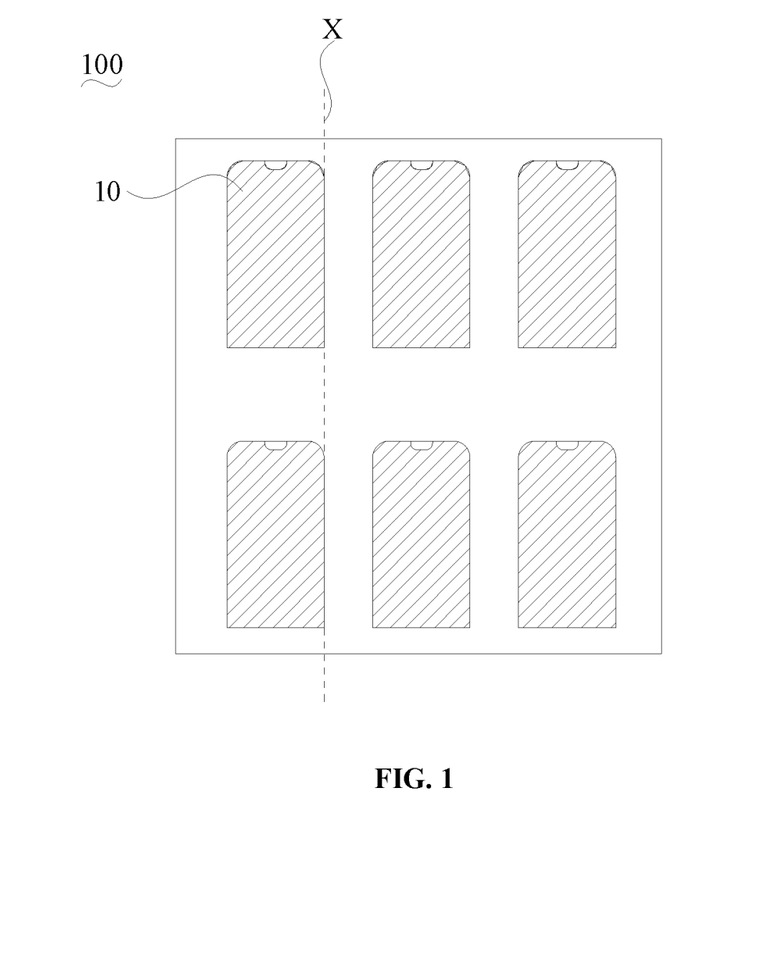
FIG. 1 is a structural schematic diagram illustrating a display panel motherboard according to an embodiment of the present disclosure.
Figure 2:
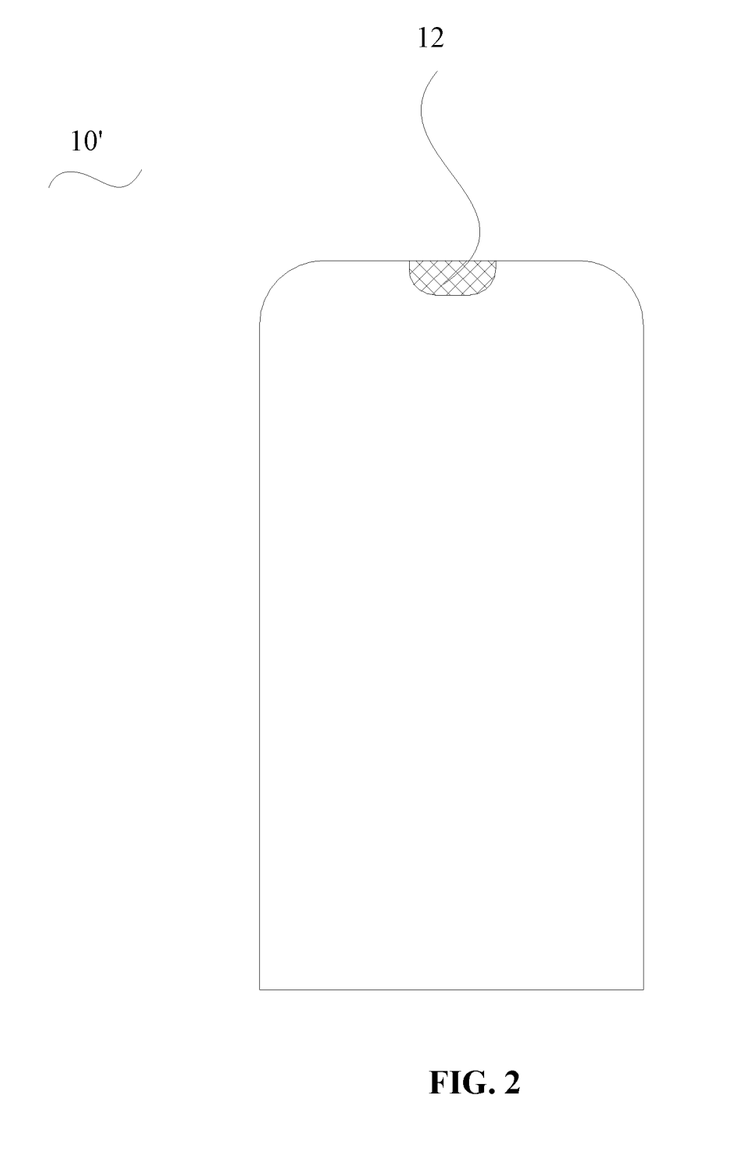
FIG. 2 is a structural schematic diagram illustrating a display panel formed from the display panel motherboard in FIG. 1.
Figure 3:
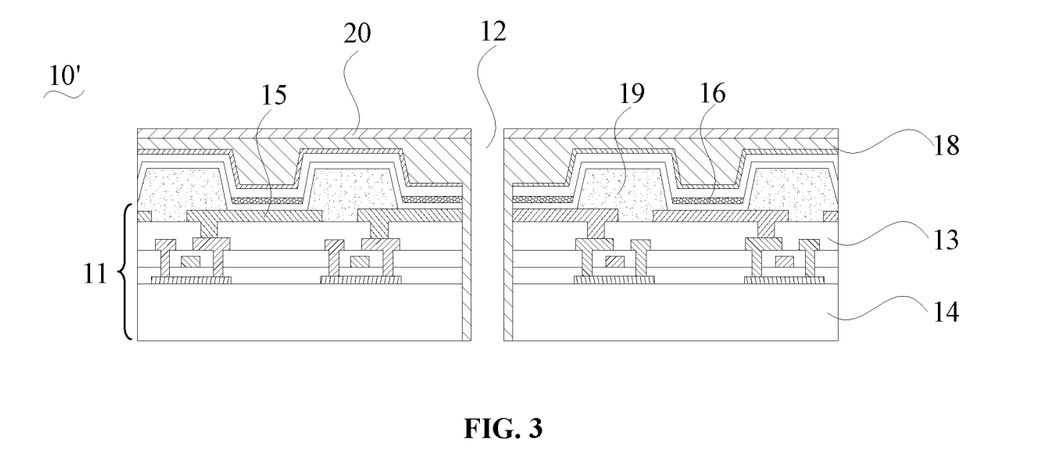
FIG. 3 is a cross-sectional diagram illustrating the display panel in FIG. 2 with an etch protection layer retained.
Figure 4:
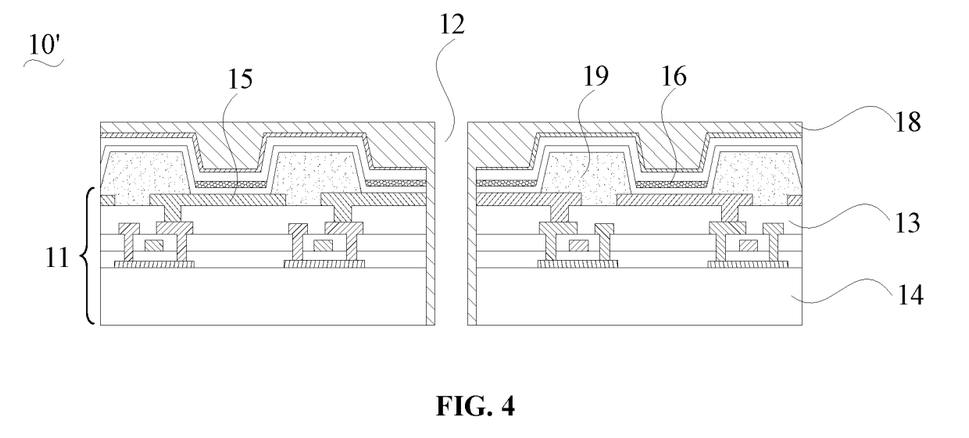
FIG. 4 is a cross-sectional diagram illustrating the display panel in FIG. 2 after the etch protection layer has been removed.

FIG. 1 is a structural schematic diagram illustrating a display panel motherboard according to an embodiment of the present disclosure. FIG. 2 is a structural schematic diagram illustrating a display panel formed from the display panel motherboard in FIG. 1. FIG. 3 is a cross-sectional diagram illustrating the display panel in FIG. 2 with an etch protection layer retained. FIG. 4 is a cross-sectional diagram illustrating the display panel in FIG. 2 after the etch protection layer has been removed. For the convenience of description, only the structure of the portion related to the embodiment of the present disclosure is shown in the above drawings.

Referring to FIG. 1 and FIG. 2, a display panel motherboard 100 according to an embodiment of the present disclosure includes a plurality of display substrates 10 and a peripheral area (not shown) surrounding the display substrate 10. The display panel 10' is formed after the mounting notch is formed on the display substrate 10.

The display substrate 10 refers to a panel cut out from the display panel motherboard 100. The display substrate 10 includes a display area used to form display elements, and a border area used to, for example, provide a signal line to display, which is not allowed to be cut off. For example, in some embodiments, one display panel in the display panel motherboard 100 may include an active area (AA) for a subsequent display screen, and may also include a border area of the subsequent display screen (including an area where a driver circuit, or a chip is disposed).

Specifically, in the embodiment shown in FIG. 1, the display panel motherboard 100 has six display substrate areas that define the positions of the display panels. The display substrate area is rectangular and bounded by four sides. The subsequent cutting is performed in accordance with four sides, for example, the X-axis as shown in FIG. 1 is the cutting axis along one of the four sides. The four sides of each of the six display substrate areas in FIG. 1 may be lines that are not actually visible, or may be visible lines that are reserved on the display panel motherboard 100. The display substrate area is not limited to a rectangle, and may be other shapes such as a circle, a hexagon, or the like.

Referring to FIG. 3 and FIG. 4, in an embodiment of the present disclosure, the display substrate 10 includes an array substrate 11, an organic light emitting unit 16, an encapsulation layer 18, and an etch protection layer 20.

The array substrate, that is, a TFT (Thin-film transistor) array substrate, refers to a base substrate in which at least a functional film layer such as a TFT array, an anode, and a pixel defining layer is formed (for example, a substrate made of a PI material).

The array substrate 11 has at least one notch reserved area (not shown), and the notch reserved area is used to provide a mounting notch 12 subsequently. The organic light emitting unit 16 is formed on the array substrate 11 and located within an area outside the notch reserved area. The encapsulation layer 18 is disposed on a side of the organic light emitting unit 16 facing away from the array substrate 11 and covers the notch reserved area. The display substrate 10 further includes an etch protection layer 20 formed on a side of the encapsulation layer 18 facing away from the array substrate.

In some embodiments, the array substrate 11 includes a base substrate 14 (e.g., made of a PI material), a thin film transistor (not shown) disposed on the base substrate 14, and an anode 15 and a functional film layer 19 disposed on the thin film transistor. The functional film layer 19 includes at least a pixel defining layer including a plurality of pixel defining openings (not shown), and the pixel defining openings are used to provide the organic light emitting unit 16. The array substrate 11 may further include a film layer such as a planarization layer 13 and a passivation layer, which is not limited hereto.

The notch reserved area may include a pre-selected and divided area on the base substrate 14, the shape of the notch reserved area may be the same as the shape of the mounting notch 12, and the graphic size of the notch reserved area and the graphic size of the mounting notch 12 may be the same. In some embodiments, the notch reserved area is located within the display area, so that the border area can be reduced, the area of the display area can be increased, and the "full screen" or "narrow border" display panel can be manufactured. In some other embodiments, the notch reserved area may also span the display area and the border area, which is not limited hereto.

The mounting notch 12 is an area for mounting a hardware structure. For convenience of description, the present disclosure names an area for mounting a hardware structure as a mounting notch, but the name does not limit the present disclosure, and therefore may be modified to other names as needed, for example, a shaped notch, a through hole, a groove, a mounting hole, etc. Preferably, the hardware structure includes at least one or more of the following structures: a front camera, a home button, a telephone receiver or a speaker. The specific mounting method of the hardware structure is not limited hereto. Furthermore, in forming the mounting notch, the shape of the mounting notch to be cut is determined according to the shape of the hardware structure to be mounted, that is, the mounting notch 12 of a different shape may be provided for different hardware structures. Preferably, the cross-sectional shape of the mounting notch 12 in the direction parallel to the base substrate may be one or more of the following shapes: circle, ellipse, rectangle, trapezoid, rhombus, square, or the like.

The organic light emitting unit 16 includes at least an organic light emitting material layer and a cathode layer formed on the organic light emitting material layer. In some embodiments, the organic light emitting material layer may have a multilayer structure, for example, in addition to the organic light emitting material layer and the cathode layer, an electron transport layer and a hole transport layer that balance electrons and holes, and an electron injecting layer and a hole injecting layer that enhance injection of electrons and holes.

The encapsulation layer 18 is disposed on a side of the organic light emitting unit 16 facing away from the array substrate 11 and covers the notch reserved area. Since the organic light-emitting material layer is very sensitive to an external environment such as moisture and oxygen, if the organic light-emitting material layer in the display panel is exposed to a moisture or oxygen atmosphere, the performance of the display panel may be drastically reduced or completely damaged. The encapsulation layer 18 is able to block air and moisture for the organic light emitting unit 16 to ensure the reliability of the display panel.

The encapsulation layer 18 may be in a single-layer or multi-layer structure, and may be an organic film layer, an inorganic film layer, or a laminated structure of an organic film layer and an inorganic film layer. For example, in some embodiments, the encapsulation layer 18 may include two inorganic film layers and one organic film layer located between the two inorganic film layers.

The etching process removes the portion of the underlying material that is not masked by the upper masking material via physical and/or chemical means, thereby obtaining a pattern corresponding to the mask pattern on the underlying material. The etching process generally includes wet etching and dry etching. The wet etching is performed by using a specific chemical reaction between the solution and the film to remove the portion of the film not masked by the photoresist mask, thereby achieving the etching.

Since the display panel is generally formed by a non-metal film layer, the etching of the film layer can be performed by dry etching (for example, ICP dry etching), that is, a radio frequency power source is used to cause reaction gas to generate highly reactive ions and electrons. The area to be etched is bombarded and chemically reacted to selectively remove the portion that needs to be removed. Thereby, the substance of the area to be etched becomes volatile gas, and is evacuated by a pumping system, and finally the desired depth is etched as designed.

The organic light emitting unit 16 is not deposited on the notch reserved area of the array substrate, and after the encapsulation layer 18 is formed, each film layer of the notch reserved area is removed by the dry etching process to form a notch. Compared with the laser cutting, the present application avoids damage to components such as the encapsulation layer 18 and the organic light-emitting unit 16 during the cutting process, thereby improving the production yield of the display panel. Meanwhile, the method also solves the problem of difficulty in alignment during laser cutting, thereby reducing the difficulty of notching and improving the accuracy of notching. Compared with the cutter wheel cutting, the method avoids abnormal display and poor sensing of the periphery of the notch area caused by damage to the film layer and the line at the periphery of the mounting notch 12 during the cutting process, thereby improving the production yield of the display panel.

Since the film layer or structure such as the encapsulation layer 18, the thin film transistor, and the base substrate 14 is required to be etched during the dry etching process, the photo-resistance failure of the display area of the display panel may be caused by exposure and development, thereby causing display failure. Therefore, the etching protection layer 20 is disposed on the side of the encapsulation layer 18 facing away from the array substrate 11 to avoid the occurrence of the above problem, thereby further improving the production yield of the display panel.

The etch protection layer 20 covers at least an area of the array substrate 11 other than the notch reserved area. In order to avoid as much as possible the effect of exposure and development on the photo-resistance of the display area, the coverage of the etch protection layer 20 should be as large as possible. Meanwhile, considering the difficulty in the manufacture process of the etch protection layer 20, the simplest design is to allow the etch protection layer 20 to cover the entire encapsulation layer 18.

In combination with the structure and manufacture process of the display panel, at least the encapsulation layer 18, the thin film transistor, the base substrate 14 and other structures or film layers are required to be etched. However, if the etching thickness is too thick, the etching effect is affected. When the thickness of the etched film layer is greater than 10 μm, the etching effect is affected to some extent. As a preferred embodiment, the etch protection layer 20 covers an area of the array substrate 11 other than the notch reserved area, so that the thickness of the etched film layer can be reduced, thereby improving the precision of the notching and realizing the protection of the display area.

In particular, the etch protection layer 20 may include a transparent material or may also include a non-transparent material. For example, the etch protection layer 20 may include a transparent ITO (Indium Tin Oxide) material. Since the etch protection layer 20 is used to reduce or avoid the influence of the exposure and development on the photo-resistance of the display area when the dry etching process is employed, the etch protection layer 20 needs to at least partially cover the display area and directly affect the display effect. Therefore, if the etch protection layer 20 is made of a non-transparent material, it needs to be removed in a subsequent process to avoid affecting the display effect. However, if the etch protection layer 20 is made of a transparent material, the etch protection layer 20 may be remained in the subsequent production process of the display panel. In this way, the risk of damage to the structure of the encapsulation layer 18 during the subsequent removal of the etch protection layer 20 is reduced without affecting the display effect.

The above non-transparent material refers to a material that is not completely transparent, for example, the non-transparent material may be a translucent material or a completely opaque material.

Based on the same inventive concept, an embodiment of the present disclosure further provides a display panel 10' formed by providing a mounting notch 12 on a display substrate 10.

Referring to FIG. 3, the display panel 10' includes the array substrate 11, the organic light emitting unit 16, the encapsulation layer 18, and the etch protection layer 20.

The display panel 10' includes at least one mounting notch 12 for providing a mounting space for the hardware structure, the mounting notch 12 extending through the display panel 10' in a direction perpendicular to the array substrate. The organic light emitting unit 16 is formed on the array substrate 11 and located within an area outside the mounting notch 12. The encapsulation layer 18 is formed on a side of the organic light emitting unit 16 facing away from the array substrate. The etch protection layer 20 is formed on a side of the encapsulation layer 18 facing away from the array substrate.

The etch protection layer 20 may be made of a transparent material.

The display panel 10' is a single body formed by cutting the display panel motherboard 100 and etching the mounting notch 12 for providing a mounting space for the hardware structure. Therefore, if the etch protection layer 20 is made of a transparent material, the etch protection layer 20 may be remained on the display panel 10 under the premise of not affecting the display effect, in order to reduce the risk of damage to the structure of the encapsulation layer 18 caused by the subsequent removal of the etch protection layer 20.

In the display panel 10' according to the embodiment of the present disclosure, the organic light emitting unit 16 is not deposited in the notch reserved area of the array substrate, and after forming the encapsulation layer 18, each film layer of the notch reserved area is removed by the dry etching process to form the notch. Compared with the laser cutting and the cutter wheel cutting, this embodiment avoids abnormal display and poor sensing of the periphery of the notch area caused by damage to the film layer and the line at the periphery of the mounting notch 12 during the cutting process, thereby improving the production yield of the display panel 10.

In addition, the etching protection layer 20 is disposed on the side of the encapsulation layer 18 facing away from the array substrate, which solves the problem that the photo-resistance failure of the display area of the display panel 10' caused by exposure and development, and improves the production yield of the display panel 10'.

In some embodiments of the present disclosure, the etch protection layer 20 at least partially covers an area of the display panel 10' other than the mounting notch 12. As a preferred embodiment, the etch protection layer 20 covers an area of the display panel 10' other than the mounting notch 12. In this way, the influence of the exposure and development on the photo-resistance of the display area can be avoided as much as possible, and the protection of the display area can be realized. In addition, the accuracy of the grooving can be improved by reducing the thickness of the etched film layer.

In some embodiments of the present disclosure, the periphery of the mounting notch 12 is provided with an encapsulation layer material with a predetermined thickness, and the encapsulation layer material with the predetermined thickness covers at least the organic light emitting unit 16 adjacent to the edge of the mounting notch 12. Thus, the side surface of the organic light-emitting unit 16 adjacent to the edge of the mounting notch 12 is also covered, improving the reliability of encapsulating the organic light-emitting unit 16. In the specific production, after the mounting notch 12 has been formed by etching, at least the organic light emitting unit 16 is covered by a thin film encapsulation at the periphery of the mounting notch 12.

The encapsulating layer material may completely cover the film layer adjacent to the periphery of the mounting notch 12, and may also partially cover the film layer adjacent to the periphery of the mounting notch 12, which is not limited hereto. The encapsulating layer material at the periphery of the mounting notch 12 should cover at least the organic light emitting unit 16 to ensure that the organic light emitting material layer or the like in the organic light emitting unit 16 is not affected by the environment. As a preferred embodiment, as shown in FIGS. 3 and 4, the encapsulating layer material completely covers the film layer adjacent to the periphery of the mounting notch 12. In this way, the encapsulating effect of the display panel 10' is ensured, and air, moisture, and the like are prevented from entering the display panel 10' from the mounting notch 12, thereby ensuring the reliability of the display panel 10.

In order to facilitate a further understanding of the technical solution of the present disclosure, an embodiment of the present disclosure further provides a method of manufacturing a display panel.

Figure 5:
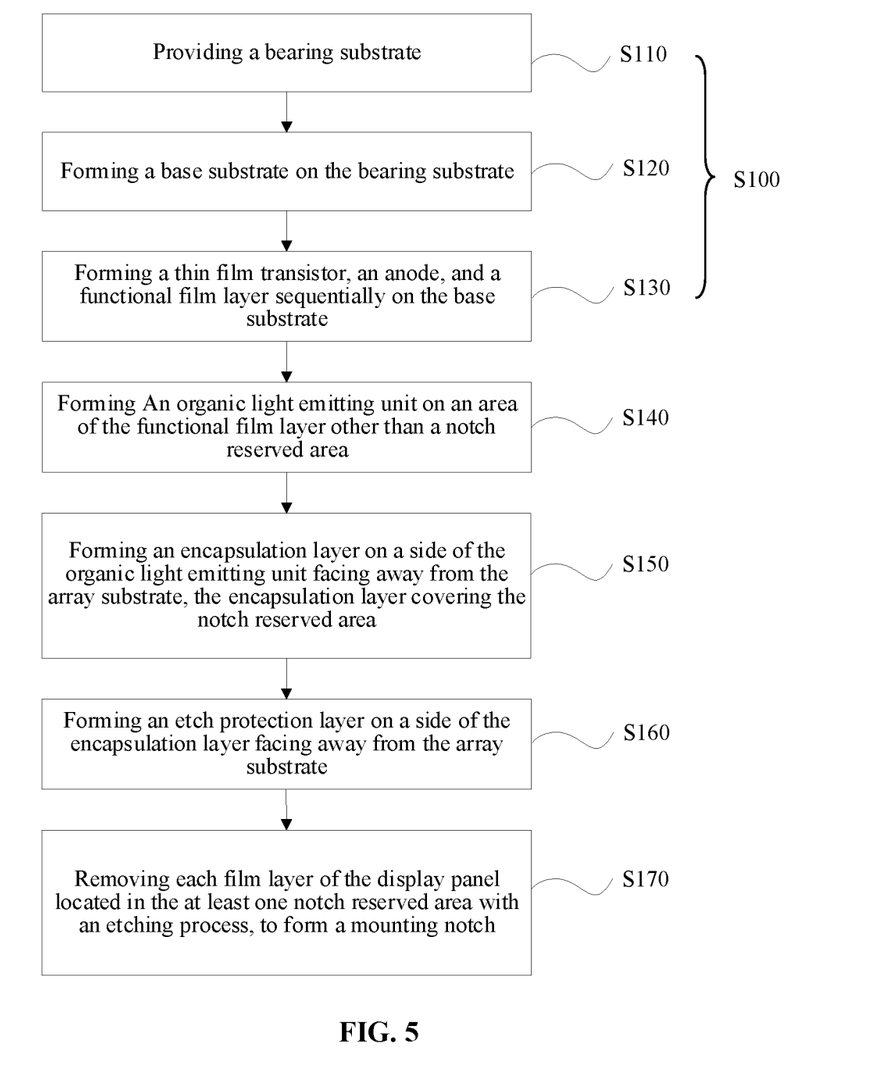
FIG. 5 is a flow diagram of a method of manufacturing a display panel according to an embodiment of the present disclosure.

FIG. 5 is a flow chart showing a method of manufacturing a display panel according to an embodiment of the present disclosure.

Referring to the drawings, an embodiment of the present disclosure provides a method of manufacturing a display panel. The display panel 10' includes an array substrate, an organic light emitting unit 16 and an encapsulation layer 18. The array substrate 11 has at least one notch reserved area. The organic light emitting unit 16 is formed on the array substrate 11 and located on an area outside the notch reserved area. The encapsulation layer 18 is formed on a side of the organic light emitting unit 16 facing away from the array substrate 11 and covers the notch reserved area. The display substrate further includes an etch protection layer 20 formed on a side of the encapsulation layer 18 facing away from the array substrate.

The method includes the following steps.

At step S100, an array substrate 11 is provided, and the array substrate 11 includes at least one notch reserved area.

Step S110 to step S130 may be included in this step S100.

At step S110, a bearing substrate is provided.

Specifically, the bearing substrate may be a glass substrate.

At step S120, a base substrate 14 is formed on the bearing substrate.

Taking the flexible display panel 10' as an example, the base substrate 14 is formed on the bearing substrate. The base substrate 14 is a flexible substrate, optionally made of organic polymer, silicon nitride, and silicon oxide. For example, the organic polymer may be a polyimide substrate, a polyamide substrate, a polycarbonate substrate, a polyphenylene ether substrate or the like. In some embodiments, the base substrate 14 may be obtained by coating polyimide glue on the bearing substrate and curing the polyimide.

At step S130, a thin film transistor, an anode 15, and a functional film layer 19 are sequentially formed on the base substrate 14.

The thin film transistor is formed on the base substrate 14. In some embodiments, an additional layer such as a buffer layer may be formed on the base substrate 14 prior to forming the thin film transistor. The buffer layer may be formed on the entire surface of the base substrate 14, or may be formed by patterning.

The buffer layer may have a suitable material including PET, PEN polyacrylate, and/or polyimide to form a layered structure in a single layer or a multilayer stack. The buffer layer may also be made of silicon oxide or silicon nitride, or may include a composite layer of an organic material layer and/or an inorganic material.

The thin film transistor may control the emission of each sub-pixel or may control the emission amount of each sub-pixel. The thin film transistor may include a semiconductor layer, a gate electrode, a source electrode, and a drain electrode. The semiconductor layer may be formed of an amorphous silicon layer, a metal oxide or a polysilicon layer, or may be made of an organic semiconductor material. In some embodiments, the semiconductor layer includes a channel region, and a source and drain regions doped with doping agent.

The semiconductor layer may be covered by a gate insulating layer, and the gate electrode may be disposed on the gate insulating layer. In general, the gate insulating layer may cover the entire surface of the base substrate 14. In some embodiments, the gate insulating layer may be formed by patterning. The gate insulating layer may be made of silicon oxide, silicon nitride, or other insulating organic or inorganic materials in consideration of adhesion to an adjacent layer, formability of a stacked target layer, and surface flatness. The gate electrode may be covered by an interlayer insulating layer formed of silicon oxide, silicon nitride, and/or other suitable insulating organic or inorganic materials. A portion of the gate insulating layer and the interlayer insulating layer may be removed, and a contact hole may be formed after the removal to expose a predetermined region of the semiconductor layer. The source electrode and the drain electrode may be in contact with the semiconductor layer through the contact hole.

Since the thin film transistor has a complicated layer structure, its top surface may be uneven. In some embodiments, the thin film transistor further includes a planarization layer 13 to form a top surface that is sufficiently flat. After the planarization layer 13 is formed, a through hole may be formed in the planarization layer 13 to expose the source and drain electrodes of the thin film transistor.

In some embodiments, the functional film layer 19 includes a pixel defining layer. The anode 15 is a pixel electrode. The pixel electrode includes a sub-pixel electrode corresponding to the sub-pixel region, and a plurality of sub-pixel electrodes are formed on the planarization layer 13. The plurality of sub-pixel electrodes is electrically connected to the thin film transistor through the aforementioned through holes. The sub-pixel electrode is generally referred to as an anode 15 herein. The pixel defining layer covers a plurality of sub-pixel electrodes, and has corresponding sub-pixel openings for defining sub-pixels, for example, the pixel defining layer may be made of a suitable organic material such as polyacrylate, polyimide, or the like or include a single material layer made of a suitable inorganic material, or a composite material layer. Specifically, in an embodiment, the pixel defining layer may be patterned to expose a central portion of each sub-pixel electrode.

After S100, a step of forming an organic light emitting unit on an area of the array substrate 11 other than the notch reserved area is performed.

The organic light emitting unit 16 includes at least an organic light emitting material layer and a cathode layer formed on the organic light emitting material layer. In some embodiments, the organic light emitting material layer may have a multilayer structure, for example, in addition to the light emitting layer, further have an electron transport layer and a hole transport layer for balancing electrons and holes, and an electron injecting layer and a hole injecting layer for enhancing electrons and holes injecting.

The array substrate 11 has a plurality of pixel regions, and each of the pixel regions may include a plurality of sub-pixel regions. For example, in some embodiments, one pixel region may be made up of a sub-pixel region that emits red light, a sub-pixel region that emits green light, and a sub-pixel region that emits blue light. The organic light emitting unit 16 may function as one pixel including a plurality of sub-pixels. In a specific manufacture process, a light-emitting layer for emitting red light, a light-emitting layer for emitting green light, and a light-emitting layer for emitting blue light may be deposited on corresponding sub-pixel regions with a precision metal mask respectively.

In some embodiments, when the array substrate 11 has the functional film layer 19, the step of forming an organic light emitting unit on an area of the array substrate other than the notch reserved area may further include step S140.

At step S140, the organic light emitting unit 16 is formed on an area of the functional film layer 19 other than the notch reserved area.

Specifically, in some embodiments, the pixel defining layer has a plurality of pixel defining openings, and each pixel defining opening is used to define a corresponding pixel. The pixel defining opening includes a plurality of sub-openings, and the corresponding sub-pixels are disposed in the corresponding sub-openings. During manufacturing, the organic light-emitting unit 16 is deposited on the pixel defining opening by evaporation, while the organic light-emitting material is not deposited on the notch reserved area.

At step S150, an encapsulation layer 18 is formed on a side of the organic light emitting unit 16 facing away from the base substrate, and the encapsulation layer 18 covers the notch reserved area.

Specifically, the encapsulation layer 18 may be formed on the array substrate 11 having the deposited organic light-emitting unit 16 by means of thin film encapsulation, and the notch reserved area is also encapsulated. Thus, the organic light-emitting unit 16 can be well protected before etching and trenching.

At step S160, an etch protection layer 20 is formed on a side of the encapsulation layer 18 facing away from the base substrate.

In some embodiments, a transparent or non-transparent etch protection layer 20 material may be applied to the side of the encapsulation layer 18 facing away from the base substrate. For example, a transparent ITO material is applied to the encapsulation layer 18 to avoid the effect of exposure and development on the photo-resistance of the display area.

At step S170, each film layer of the display substrate located within the at least one notch reserved area is removed by an etching process to form the mounting notch 12.

Specifically, the encapsulation layer 18, the thin film transistor, the base substrate 14, and other film layers or structures are etched and removed by dry etching (for example, ICP dry etching), thereby forming the mounting notch 12.

For the method of manufacturing the display panel according to the embodiment of the present disclosure, the organic light emitting unit 16 is not deposited on the notch reserved area of the array substrate, and after the encapsulation layer 18 is formed, each film layer of the notch reserved area is removed by the dry etching process to form a notch. Compared with the laser cutting and the cutter wheel cutting, the present application avoids abnormal display and poor sensing of the periphery of the notch area caused by damage to the film layer and the line at the periphery of the mounting notch 12 during the cutting process, thereby improving the production yield of the display panel 10. In addition, the etching protection layer 20 is disposed on the side of the encapsulation layer 18 facing away from the array substrate, which solves the problem of photo-resistance failure of the display area of the display panel 10' caused by exposure and development, and improves the production yield of the display panel 10.

In some embodiments of the present disclosure, the etch protection layer 20 is made of a non-transparent material. The method may also include the following steps.

At step S180, the etch protection layer 20 is removed.

Specifically, the etch protection layer 20 may be removed from the encapsulation layer 18 by mechanical or chemical removal, thereby preventing the etch protection layer 20 of the non-transparent material from affecting the display effect.

Based on the display panel 10' described above, an embodiment of the present disclosure further provides a display device. In some embodiments, the display device may be a display terminal, such as a tablet computer. In other embodiments, the display device may be a mobile communication terminal, such as a mobile phone.

In some embodiments, the display device includes a display panel 10' and a control unit or called as a control circuit configured to transmit a display signal to the display panel 10.

Above all, for the display panel motherboard 100, the display panel 10, the method of manufacturing the same, and the display device provided in the embodiments of the present disclosure, the organic light emitting unit 16 is not deposited on the notch reserved area of the array substrate, and after the encapsulation layer 18 is formed, each film layer of the notch reserved area is removed by the dry etching process to form a notch. Compared with the laser cutting in the conventional technology, the present application avoids damage to components such as the encapsulation layer 18 and the organic light-emitting unit 16 during the cutting process, thereby improving the production yield of the display panel 10. Meanwhile, the present application also solves the problem of difficulty in alignment during laser cutting, thereby reducing the difficulty of notching and improving the accuracy of notching. Compared with the cutter wheel cutting, the present application avoids abnormal display and poor sensing of the periphery of the notch area caused by damage to the film layer and the line at the periphery of the mounting notch 12 during the cutting process, thereby improving the production yield of the display panel 10.

The etching protection layer 20 is disposed on the side of the encapsulation layer 18 facing away from the array substrate, which solves the problem of photo-resistance failure of the display area of the display panel 10' caused by exposure and development, and improves the production yield of the display panel 10.

All of the technical features in the above embodiments may be employed in arbitrary combinations. For purpose of simplifying the description, not all arbitrary combinations of the technical features in the above embodiments are described. However, as long as such combinations of the technical features are not contradictory, they should be considered as within the scope of the disclosure in the specification.

The above-mentioned embodiments are merely illustrative of several embodiments of the present disclosure, and the description thereof is more specific and detailed, but is not to be construed as limiting the scope of the present disclosure. It should be noted that variations and modifications may be made by those skilled in the art without departing from the scope of the present disclosure. Therefore, the scope of the present disclosure should be determined by the appended claims.

The invention claimed is:

1. A display panel motherboard, comprising a plurality of display substrates, wherein the display substrate comprises:
    an organic light emitting unit;
    an array substrate, having at least one first area acting as a notch reserved area, and a second area different from the first area, the organic light emitting unit being formed on the array substrate and located on the second area;
    a mounting notch penetrating a top and bottom surface of the display substrate;
    an encapsulation layer, formed on a side of the organic light emitting unit facing away from the array substrate and covering the notch reserved area, the notch reserved area being substantially free of organic emitting units, the encapsulation layer overlaying a sidewall of the organic light emitting unit adjacent to the mounting notch; and
    an etch protection layer formed on a side of the encapsulation layer facing away from the array substrate.

2. The display panel motherboard according to claim 1, wherein the etch protection layer overlays the second area of the array substrate.

3. The display panel motherboard according to claim 1, wherein the etch protection layer comprises a transparent material.

4. The display panel motherboard according to claim 1, wherein the display substrate comprises a display area and a border area surrounding the display area, and
    the notch reserved area is positioned within the display area.

5. A display panel, comprising:
    an array substrate, provided with at least one mounting notch, the mounting notch extending through the display panel in a direction perpendicular to the array substrate;
    an organic light emitting unit, formed on the array substrate and positioned on an area outside the mounting notch;
    an encapsulation layer, formed on a side of the organic light emitting unit facing away from the array substrate; and
    an etch protection layer, formed on a side of the encapsulation layer facing away from the array substrate;
    wherein a periphery of the mounting notch is provided with an encapsulating layer material having a predetermined thickness, and wherein the encapsulating layer material having the predetermined thickness covers at least one of the organic light emitting units adjacent to the periphery of the mounting notch.

6. The display panel according to claim 5, wherein the etch protection layer comprises a transparent material.

7. The display panel according to claim 5, wherein the etch protection layer covers at least an area of the display panel other than the mounting notch.

8. A method of manufacturing a display panel, comprising:
    providing an array substrate, the array substrate comprising at least one first area acting as a notch reserved area, and a second area different from the first area;
    forming an organic light emitting unit on the second area of the array substrate;
    forming an encapsulation layer on a side of the organic light emitting unit facing away from the array substrate, the encapsulation layer covering the notch reserved area;
    forming an etch protection layer on a side of the encapsulation layer facing away from the array substrate to form a display substrate; and
    removing each film layer of the display substrate located within the notch reserved area with an etching process, to form a mounting notch.

9. The method according to claim 8, wherein the providing the array substrate comprises:
   providing a bearing substrate;
   forming a base substrate on the bearing substrate; and
   forming a thin film transistor, an anode, and a functional film layer sequentially on the base substrate.

10. The method according to claim 9, wherein the forming the organic light emitting unit on the second area of the array substrate comprises: forming the organic light emitting unit on the functional film layer within the second area.

11. The method according to claim 8, wherein the etch protection layer comprises a non-transparent material, and the method further comprises removing the etch protection layer.

12. The method according to claim 9, wherein the forming the thin film transistor, the anode and the functional film layer sequentially on the base substrate further comprises:
   forming a buffer layer on the base substrate, prior to the forming the thin film transistor.

13. The method according to claim 9, wherein the forming the thin film transistor, the anode, and the functional film layer sequentially on the base substrate further comprises:
   forming a planarization layer on the formed thin film transistor, to form a planar top surface; and
   forming a through hole in the planarization layer, to expose a source electrode and a drain electrode of the thin film transistor.

14. The method according to claim 8, wherein the organic light emitting unit further comprises a plurality of sub-pixels, the array substrate further comprises a pixel defining layer, the pixel defining layer has a plurality of pixel defining openings, each of the pixel defining openings comprises a plurality of sub-openings, and the forming the organic light emitting unit on the second area of the array substrate further comprises: depositing a light emitting layer for emitting red light, a light emitting layer for emitting green light, and a light emitting layer for emitting blue light on the corresponding plurality of sub-openings in the pixel defining layer respectively with a precision metal mask by an evaporation process, to form the corresponding plurality of sub-pixels.

* * * * *